United States Patent
Subramani et al.

(10) Patent No.: US 11,170,982 B2
(45) Date of Patent: Nov. 9, 2021

(54) METHODS AND APPARATUS FOR PRODUCING LOW ANGLE DEPOSITIONS

(71) Applicant: APPLIED MATERIALS, INC., Santa Clara, CA (US)

(72) Inventors: Anantha K. Subramani, San Jose, CA (US); Praburam Raja, San Jose, CA (US); Steven V. Sansoni, Livermore, CA (US); John Forster, Sunnyvale, CA (US); Philip Kraus, San Jose, CA (US); Yang Guo, Fremont, CA (US); Prashanth Kothnur, San Jose, CA (US); Farzad Houshmand, Mountain View, CA (US); Bencherki Mebarki, Santa Clara, CA (US); John Joseph Mazzocco, San Jose, CA (US); Thomas Brezoczky, Los Gatos, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 244 days.

(21) Appl. No.: 16/529,211

(22) Filed: Aug. 1, 2019

(65) Prior Publication Data

US 2020/0051794 A1 Feb. 13, 2020

Related U.S. Application Data

(60) Provisional application No. 62/717,705, filed on Aug. 10, 2018.

(51) Int. Cl.
*H01J 37/34* (2006.01)
*B08B 7/00* (2006.01)
*H01L 21/033* (2006.01)

(52) U.S. Cl.
CPC .......... *H01J 37/3405* (2013.01); *B08B 7/00* (2013.01); *H01J 37/342* (2013.01); *H01L 21/033* (2013.01)

(58) Field of Classification Search
CPC .. H01J 37/3405; H01J 37/342; H01J 37/3423; H01L 21/033; B08B 7/00
(Continued)

(56) References Cited

U.S. PATENT DOCUMENTS

| | | | | |
|---|---|---|---|---|
| 4,915,805 A | * | 4/1990 | Rust | C23C 14/3407 |
| | | | | 204/192.12 |
| 5,277,779 A | * | 1/1994 | Henshaw | C23C 14/3407 |
| | | | | 204/192.12 |

(Continued)

FOREIGN PATENT DOCUMENTS

| | | | |
|---|---|---|---|
| JP | 02-305960 | * | 12/1990 |
| JP | 11-199377 A | | 7/1999 |
| JP | 5873557 B2 | | 3/2016 |

OTHER PUBLICATIONS

Machine Translation JP 02-305960 (Year: 1990).*
(Continued)

*Primary Examiner* — Rodney G McDonald
(74) *Attorney, Agent, or Firm* — Moser Taboada (57) ABSTRACT

Methods and apparatus for low angle, selective plasma deposition on a substrate. A plasma chamber uses a process chamber having an inner processing volume, a three dimensional (3D) magnetron with a sputtering target with a hollow inner area that overlaps at least a portion of sides of the sputtering target and moves in a linear motion over a length of the sputtering target, a housing surrounding the 3D magnetron and the sputtering target such that at least one side of the housing exposes the hollow inner area of the sputtering target, and a linear channel interposed between the housing and a wall of the process chamber.

20 Claims, 5 Drawing Sheets

(58) Field of Classification Search
USPC .......................................... 204/298.18–298.2
See application file for complete search history.

(56) References Cited

U.S. PATENT DOCUMENTS

| | | | |
|---|---|---|---|
| 6,063,707 A | 5/2000 | Atwater et al. | |
| 6,444,100 B1* | 9/2002 | McLeod | C23C 14/35 |
| | | | 204/192.12 |
| 2004/0020768 A1* | 2/2004 | Wang | C23C 14/35 |
| | | | 204/298.2 |
| 2004/0020770 A1* | 2/2004 | Wang | C23C 14/046 |
| | | | 204/298.18 |
| 2011/0240461 A1 | 10/2011 | Guo et al. | |
| 2014/0238843 A1 | 8/2014 | Nguyen et al. | |
| 2017/0175247 A1 | 6/2017 | Weichart | |

OTHER PUBLICATIONS

Perspectives on oblique angle deposition of thin films: From fundamentals to devices, Barranco et al., Aug. 28, 2015, 95 pages.
Room-temperature tilted-target sputtering deposition of highly transparent and low sheet resistance Al doped ZnO electrodes, Nagiri et al., Apr. 14, 2015, 20 pages.
Antibacterial Strategies for Titanium Biomaterials. Erik Unosson, Jun. 2015, 75 pages.
International Search Report and Written Opinion for PCT/US2019/045302, dated Nov. 20, 2019.

* cited by examiner

FIG. 8 ns for producing low angle depositions have been described.

METHODS AND APPARATUS FOR PRODUCING LOW ANGLE DEPOSITIONS

CROSS-REFERENCE TO RELATED APPLICATIONS

This application claims benefit of U.S. provisional patent application Ser. No. 62/717,705, filed Aug. 10, 2018 which is herein incorporated by reference in its entirety.

FIELD

Embodiments of the present principles generally relate to semiconductor processing.

BACKGROUND

Semiconductors are formed in one or more process chambers which have the capability to process substrates (e.g., semiconductor wafers) in a controlled processing environment. In a plasma vapor deposition (PVD) chamber, materials are deposited on substrates using a sputter target composed of the deposited material. Plasma is generated within the PVD chamber causing the target to sputter or deposit the material onto the substrate. The deposition is typically uniform over the surface of the substrate. The inventors have observed that in some cases, uniform deposition over the entire surface of the substrate is not desirable.

Thus, the inventors have provided improved methods and apparatus for producing low angle depositions in a PVD process chamber.

SUMMARY

Methods and apparatus for producing low angle depositions on substrates enable applications such as, for example, hard masking during semiconductor processes In some embodiments, a three dimensional (3D) magnetron for plasma deposition on a substrate comprises an inner pole piece with a top surface in a first plane and an outer pole piece which includes a first portion and a second portion having top surfaces in the first plane, wherein the first portion and the second portion are positioned on opposite sides of the inner pole piece, a third portion with a first end connected to a first end of the first portion and extending upward beyond the first plane in a perpendicular direction, a fourth portion with a first end connected to a second end of the first portion and extending upward beyond the first plane in a perpendicular direction, a fifth portion with a first end connected to a first end of the second portion and extending upward beyond the first plane in a perpendicular direction, a sixth portion with a first end connected to a second end of the second portion and extending upward beyond the first plane in a perpendicular direction, a seventh portion with a first end connected to a second end of the third portion and a second end connected to a second end of the fifth portion, and an eighth portion with a first end connected to a second end of the fourth portion and a second end connected to a second end of the sixth portion.

In some embodiments, the 3D magnetron may further comprise wherein an inner surface of the third portion, an inner surface of the fifth portion, and an inner surface of the seventh portion lie in a second plane perpendicular to the first plane and an inner surface of the fourth portion, an inner surface of the sixth portion, and an inner surface of the eighth portion lie in a third plane perpendicular to the first plane and parallel to the second plane; and/or wherein the inner pole piece has a first set of one or more magnets to generate a first polarity and the outer pole piece has a second set of one or more magnets to generate a second polarity.

In some embodiments, an apparatus for sputter deposition in a semiconductor chamber comprises a three dimensional (3D) magnetron, a sputtering target with a hollow inner area and with at least a portion of at least one side overlapped by the 3D magnetron, and a housing surrounding the 3D magnetron and the sputtering target such that at least one side of the housing exposes the hollow inner area of the sputtering target.

In some embodiments, the apparatus further comprises cooling inlets on the housing such that a cooling liquid can come into contact with the 3D magnetron to decrease a temperature of the 3D magnetron; a motor interrelating with the 3D magnetron to move the 3D magnetron in a linear motion over a length of the sputtering target; a second magnetron for cleaning sides of the sputtering target, wherein the second magnetron interrelates with a motor to move the second magnetron in a linear motion over the length of the sputtering target; and/or wherein the housing allows either of the 3D magnetron or the second magnetron to be stored beyond either end of the sputtering target.

In some embodiments, an apparatus for plasma deposition comprises a process chamber having an inner processing volume, a three dimensional (3D) magnetron with a sputtering target with a hollow inner area, wherein the 3D magnetron overlaps at least a portion of sides of the sputtering target and moves in a linear motion over a length of the sputtering target, a housing surrounding the 3D magnetron and the sputtering target such that at least one side of the housing exposes the hollow inner area of the sputtering target, and a linear channel interposed between the housing and a wall of the process chamber.

In some embodiments, the apparatus may further include wherein angle of the linear channel and the housing relative to the wall of the process chamber is less than 45 degrees; a collimation plate affixed to at least a portion of a bottom of the linear channel; a biasing power source electrically connected to the collimation plate; wherein the biasing power source provides up to approximately 30 volts; a first magnetic assembly with at least one magnet positioned beneath the collimation plate in atmosphere; wherein the first magnetic assembly has at least one electromagnet; a second magnetic assembly with at least one magnet positioned above at least a portion of the collimation plate; wherein the second magnetic assembly has at least one electromagnet; a substrate support located within the inner processing volume of the process chamber and configured to move in a horizontal direction at a constant velocity; a substrate support located within the inner processing volume of the process chamber and configured to move in a vertical direction with a variable velocity; and/or a second magnetron positioned within the housing which is configured to clean the sputtering target and moves in a linear motion over the length of the sputtering target.

Other and further embodiments are disclosed below.

BRIEF DESCRIPTION OF THE DRAWINGS

Embodiments of the present principles, briefly summarized above and discussed in greater detail below, can be understood by reference to the illustrative embodiments of the principles depicted in the appended drawings. However, the appended drawings illustrate only typical embodiments of the principles and are thus not to be considered limiting of scope, for the principles may admit to other equally effective embodiments.

To facilitate understanding, identical reference numerals have been used, where possible, to designate identical elements that are common to the figures. The figures are not drawn to scale and may be simplified for clarity. Elements and features of one embodiment may be beneficially incorporated in other embodiments without further recitation.

DETAILED DESCRIPTION

The methods and apparatus provide for an enhanced low angle PVD deposition for applications, such as, for example, hard masking. A sputtering magnetron with a third dimension is used to increase sputtering species when sputtering with a hollow cathode (sputtering target). The 3D sputtering magnetron and sputtering target are placed at a low angle with respect to a substrate which is located in the PVD chamber. The collimation of the sputtered ions is controlled, in part, by a combination of geometry and a biased collimation plate and/or controlled, in part, by magnets placed near the ion collimation for the processing volume. The magnets may be placed below the biased collimation plate in atmosphere for ease of control and ease of changing or moving the magnets for cleaning or for particular processes. The substrate may be moved vertically and/or horizontally during sputtering to achieve a desired deposition pattern on the substrate.

Figure 1:
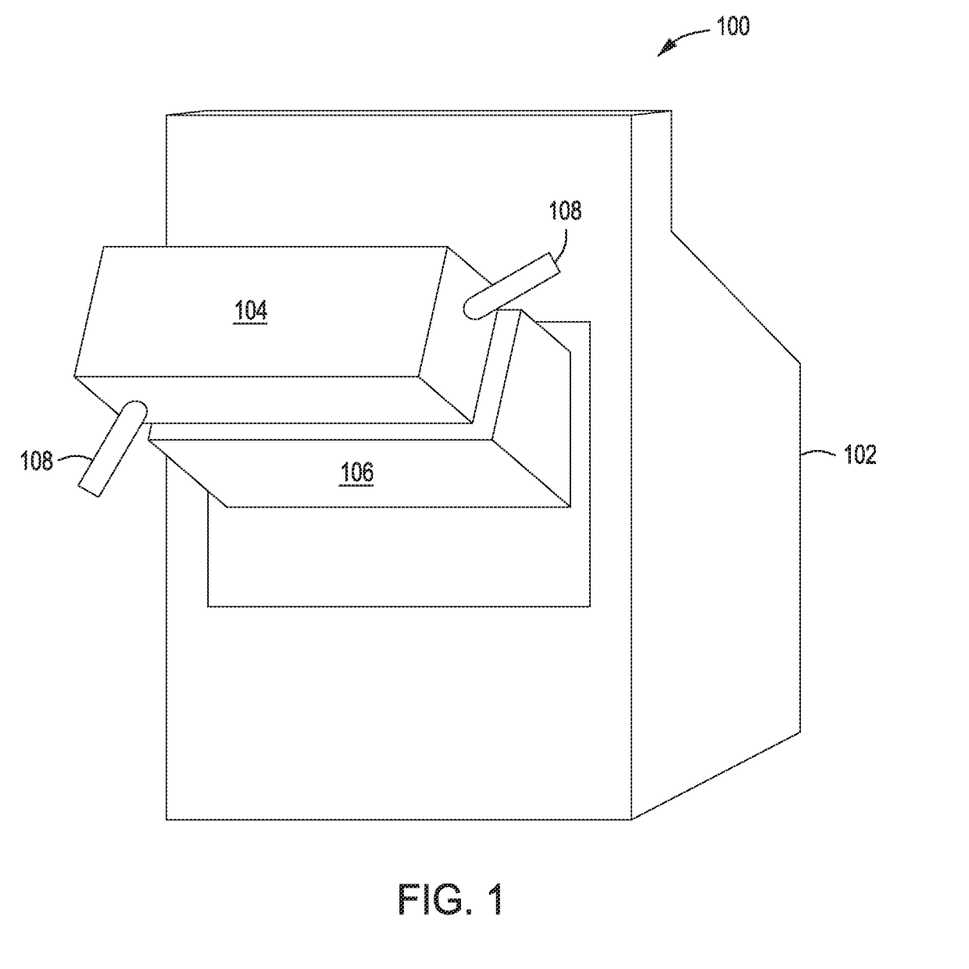
FIG. 1 is an isometric view of a PVD chamber for producing low angle depositions on a substrate in accordance with some embodiments of the present principles.

FIG. 1 is an isometric view 100 of a PVD chamber 102 for producing low angle depositions on a substrate in accordance with some embodiments. A housing 104 and a linear channel 106 are attached at a low angle with respect to a substrate in a processing volume of the PVD chamber 102. The housing 104 encases at least one magnetron and a hollow target (see FIG. 2). The housing 104 may be made from a non-ferrous material such as a plastic material and the like that does not interfere with the operation of a magnetron. The housing 104 may also include cooling hose connections 108 to provide cooling of the magnetron. In some embodiments, the magnetron is cooled with a liquid coolant such as water and the like. The linear channel 106 helps to guide the ions during sputtering and may be made of a material such as aluminum and the like.

Figure 2:
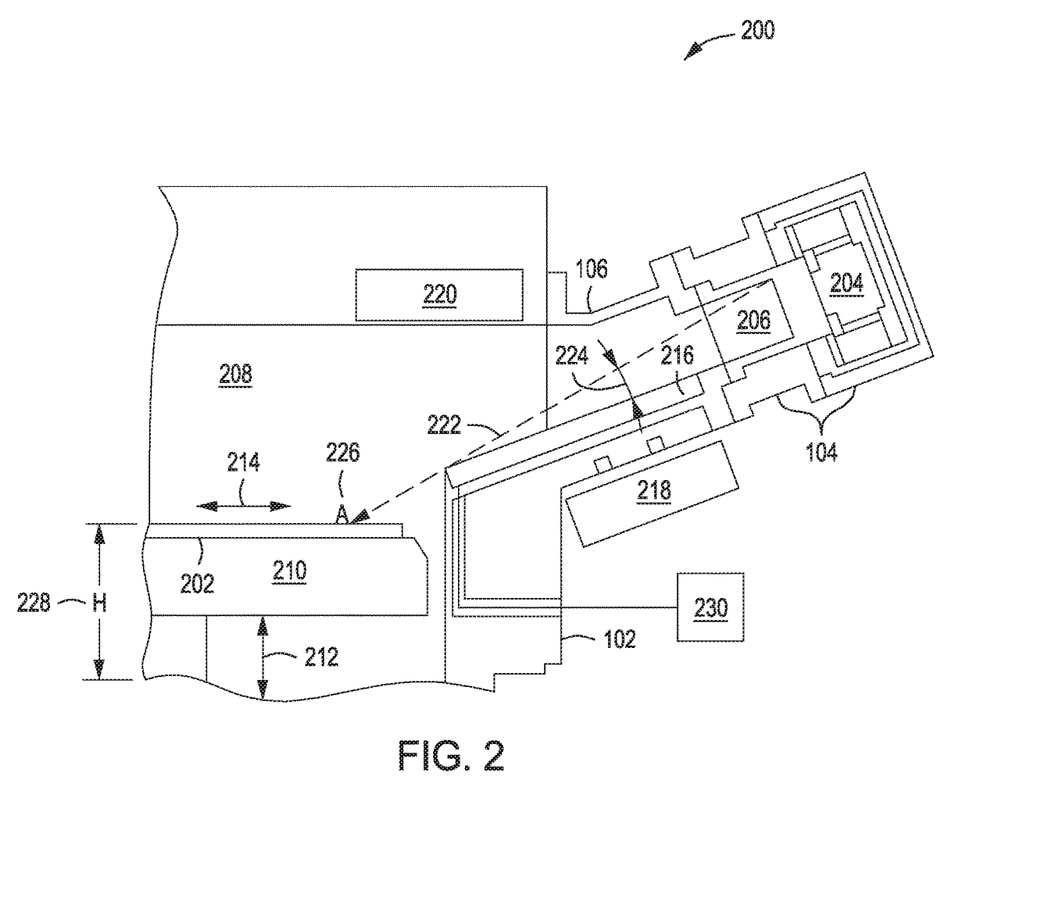
FIG. 2 is a cross-sectional view of a PVD chamber for producing low angle depositions on a substrate in accordance with some embodiments of the present principles.

FIG. 2 is a cross-sectional view 200 of the PVD chamber 102 for producing low angle depositions on a substrate 202 in accordance with some embodiments. The housing 104 encases at least one 3D sputtering magnetron 204 and one hollow sputtering target 206. During sputtering, the linear channel 106 provides ion guidance (collimation) towards the substrate 202. The housing 104 and the linear channel 106 are set at a low angle (less than 45 degrees) relative to the substrate 202. The substrate 202 in an inner processing volume 208 may be held by a substrate support 210 that may also be movable in a vertical direction 212 and/or a horizontal direction 214 to alter deposition rates, thicknesses, and/or patterning on the substrate 202. The PVD chamber 102 may also include a collimation plate 216. In some embodiments, the collimation plate 216 may be biased with up to approximately 30 volts to provide electrostatic guidance of ions during sputtering processes. The biasing voltage may be provided by a biasing power source 230. The bias on the collimation plate 216 may be positive so that ions are repelled in order to minimize loss of ions to the surface of the collimation plate 216. The biasing increases the ion yield on the substrate 202.

In some embodiments, a first magnetic assembly 218 may be placed in atmosphere in proximity of the collimation plate 216 to further assist in providing magnetic fields to help guide the ions towards the substrate 202 during sputtering. By allowing the first magnetic assembly 218 to be in atmosphere rather than embedded into the PVD chamber 102, the magnets of the first magnetic assembly 218 may be easily cooled (e.g., when using electromagnets) and may be easily changed to provide different angle control and/or different fields without interrupting the vacuum seal of the process chamber. Different processes may use different angle controls in different directions and/or different field patterns or strengths which use different sets of magnets.

In some embodiments, a second magnetic assembly 220 may be positioned above the inner processing volume 208 to assist in providing magnetic fields to help guide the ions towards the substrate 202 during sputtering. The inventors have found that having magnetic fields above the sputtered ions provides better results than having magnetic fields below the sputtered ions. The first magnetic assembly 218 and the second magnetic assembly 220 may use permanent magnets and/or electromagnets. The first magnetic assembly 218 and the second magnetic assembly 220 may be used in conjunction or separately to provide magnetic fields for ion guidance.

The dashed arrow 222 represents the largest acute angle 224 that an ion from the hollow sputtering target 206 may have during sputtering. Ions neutrons at the largest acute angle 224 will strike the substrate 202 at point A 226 when the substrate 202 is at a height H 228. If the substrate 202 is raised vertically greater than height H 228, the ion will strike the substrate to the right of point A 226. If the substrate 202 is lowered vertically less than height H 228, the ion will strike the substrate 202 to the left of point A 226. Thus, raising and lowering the substrate 202 vertically provides control over the deposition of material during sputtering. As the substrate 202 is raised vertically higher, the deposition rate increases (the ions travel less distance before striking the substrate 202). As the substrate 202 is vertically lowered, the deposition rate decreases (the ions travel further before striking the substrate 202). In some embodiments, deposition rate and vertical speed are adjusted to provide a uniform deposition pattern.

In some embodiments, the substrate 202 is moved in a horizontal direction 214 during sputtering. The horizontal movement of the substrate 202 controls which portion of the substrate 202 will have deposition. One advantage of the horizontal movement of the substrate 202 over vertical movement is that the deposition rate remains approximately constant while enabling control of which areas of the substrate 202 receive deposition. In some embodiments, horizontal and vertical movements of the substrate 202 may be used along with varying deposition rate control.

Figure 3:
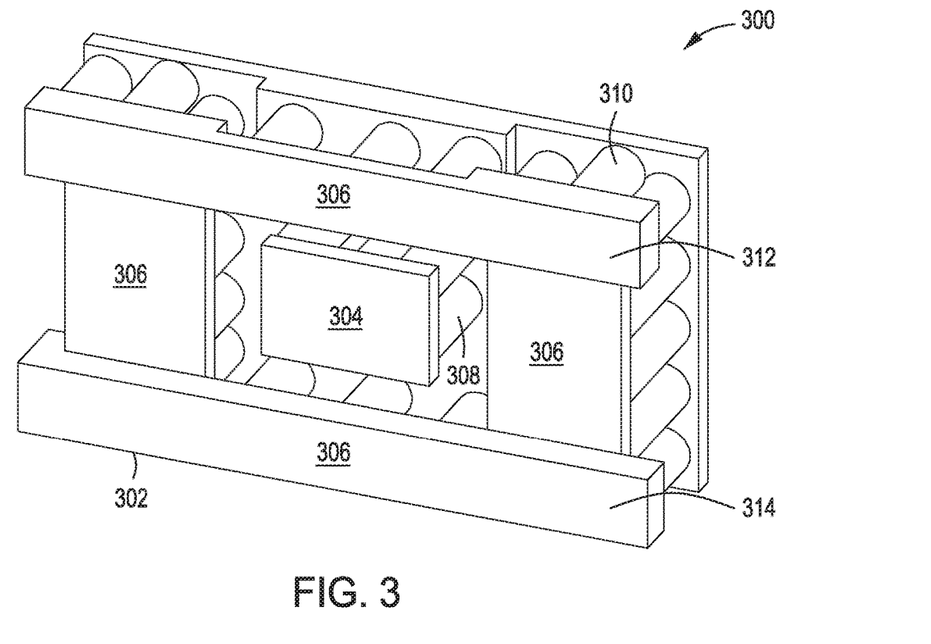
FIG. 3 is an isometric view of a three-dimensional (3D) sputtering magnetron in accordance with some embodiments of the present principles.

FIG. 3 is an isometric view 300 of a 3D sputtering magnetron 302 in accordance with some embodiments. The 3D sputtering magnetron 302 has a first pole piece 304 with a first set of one or more magnets 308 and a second pole piece 306 with a second set of one or more magnets 310. The polarity of the first pole piece 304 and the polarity of the second pole piece 306 are different. The upper longitudinal section 312 of the second pole piece 306 and the lower longitudinal section 314 of the second pole piece 306 extend over the sides of a target yielding a third dimension in which the magnetic fields of the 3D sputtering magnetron 302 operate in (see FIGS. 7 and 8). The amount of extension over the sides of a target may be adjusted to yield a particular magnetic field for a given process. The inventors have found that adjusting coverage of the sides of a target controls the areas of target erosion. In some embodiments, the first set of one or more magnets 308 and the second set of one or more magnets 310 may be configured to provide magnetic fields parallel to a top/back of a target and perpendicular to a sidewall of a target to ensure minimum sidewall erosion.

Figure 4:
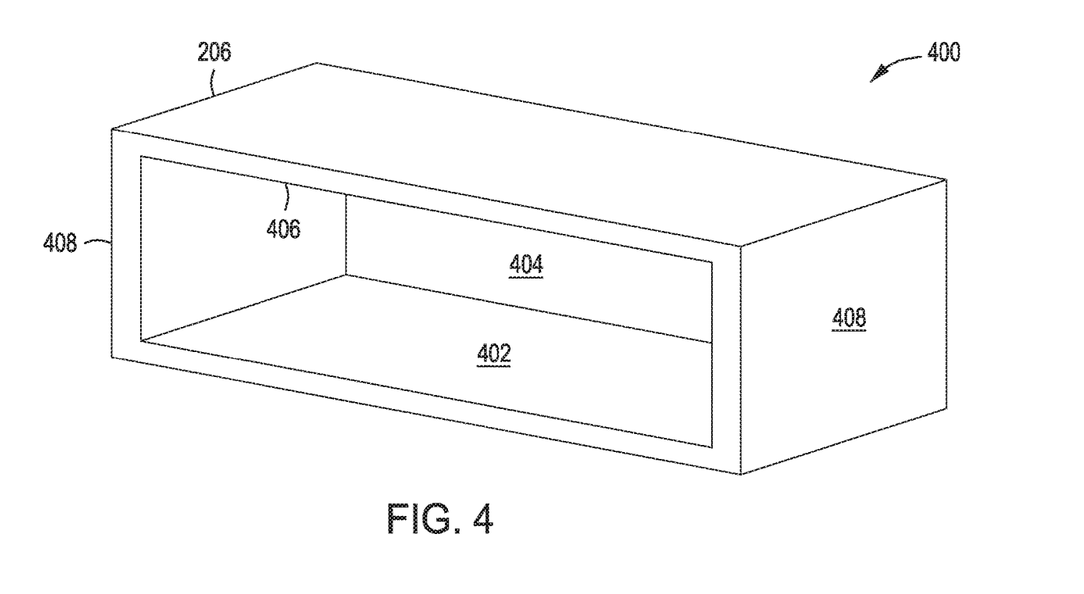
FIG. 4 is an isometric view of a sputtering target for use with a 3D sputtering magnetron in accordance with some embodiments of the present principles.

FIG. 4 is an isometric view 400 of the hollow sputtering target 206 for use with the 3D sputtering magnetron 302 in accordance with some embodiments. The hollow sputtering target 206 sputters from an inner bottom surface 402, an inner top surface 406 and from an inner back surface 404. The terms back, top, and bottom are relative terms to FIG. 4 as the hollow sputtering target 206 may be installed in different orientations. The hollow shape of the hollow sputtering target 206 allows for more ionizing fields to be created by the 3D sputtering magnetron 302 and produces more flux (ionized species) for extraction. The hollow sputtering target 206 may be composed of material such as, for example, titanium, titanium nitride, silicon, silicon oxide, and/or carbon and the like for mask applications. Other materials may be utilized for different applications.

Figure 5:
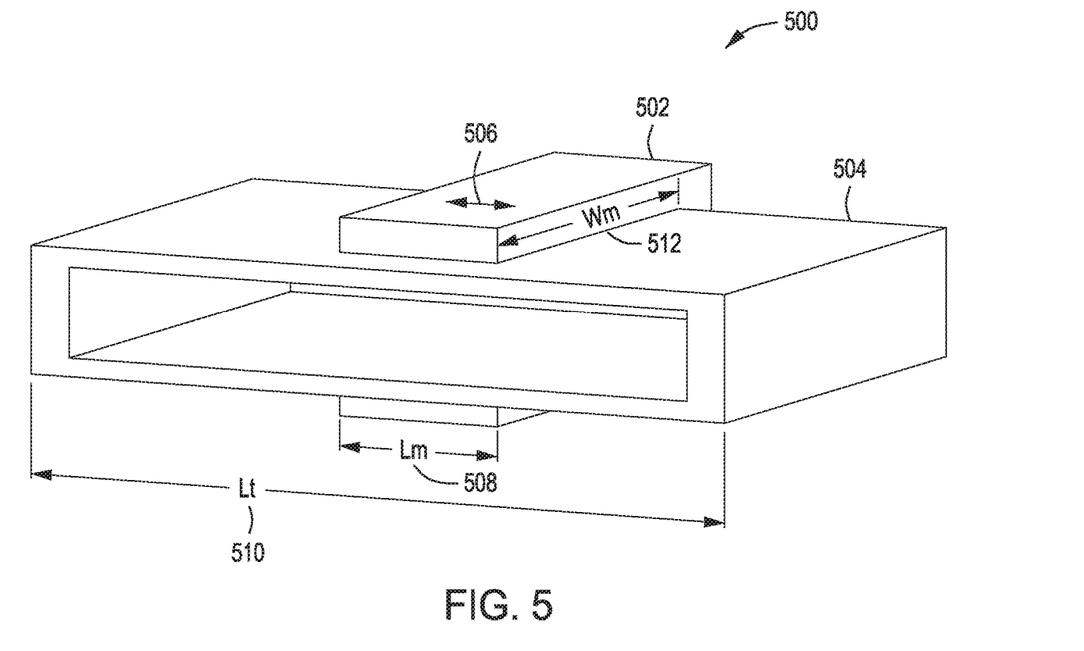
FIG. 5 is an isometric view of a 3D magnetron in relation to a sputtering target in accordance with some embodiments of the present principles.

FIG. 5 is an isometric view 500 of a 3D sputtering magnetron 502 in relation to a sputtering target 504 in accordance with some embodiments. The 3D sputtering magnetron 502 has a length $L_m$ 508 that is smaller than a length $L_t$ 510 of the sputtering target 504. In some embodiments, the 3D sputtering magnetron 502 moves in a linear direction 506 back and forth across the length $L_t$ 510 of the sputtering target 504 during deposition processes. The back and forth motion may be provided by a motor and the like. The back and forth motion of the 3D sputtering magnetron 502 provides for uniform deposition and helps in even sputtering of the sputtering target surfaces. Additionally, by controlling the residence time of the magnet along the length of the target, the thickness profile on the wafer can be tailored. As noted above, a width $W_m$ 512 of the 3D sputtering magnetron may be adjusted depending on a process being performed. The width $W_m$ 512 of the 3D sputtering magnetron may also be adjusted to provide more (reduced width) or less (increased width) target erosion on the inner back surface 404 of the hollow sputtering target 206 by reducing the width $W_m$ 512.

Figure 6:
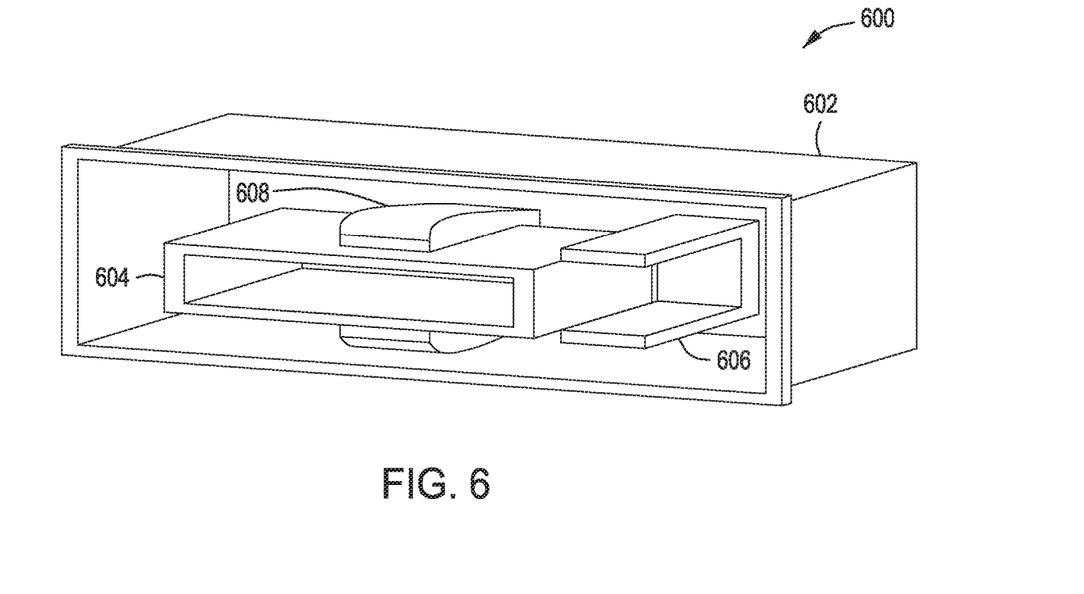
FIG. 6 is an isometric view of a housing with a 3D sputtering magnetron and a cleaning magnetron in accordance with some embodiments of the present principles.

FIG. 6 is an isometric view 600 of a housing 602 with a sputtering target, 604 a 3D sputtering magnetron 606 and a cleaning magnetron 608 in accordance with some embodiments. The housing 602 is large enough to allow the 3D sputtering magnetron 606 to be parked at one end of the sputtering target 604 to allow the cleaning magnetron 608 to move linearly across the width of the sputtering target 604 to aid in cleaning the inner surfaces of the sputtering target 604. The opening of the housing 602 has been exaggerated to better show the positioning of the components inside the housing 602. The opening of the housing 602 would be generally closer to the dimensions of the target opening to allow sputtering without being too large to allow vacuum loss of the process chamber or any other types of contamination caused by a large opening for the housing 602. In some embodiments, the cleaning magnetron 608 is used in conjunction with a shutter (not shown) that covers the substrate and/or substrate support to protect the substrate and/or substrate support from depositions caused by the cleaning process. In some embodiments, the cleaning magnetron 608 is angled to clean the top inner surfaces and the bottom inner surfaces of the sputtering target 604. In some embodiments, the cleaning magnetron 608 may be parked at the opposite end of the sputtering target 604 when the 3D sputtering magnetron 606 is performing a process. In some embodiments, the cleaning magnetron may be a type of 3D sputtering magnetron.

Figure 7:
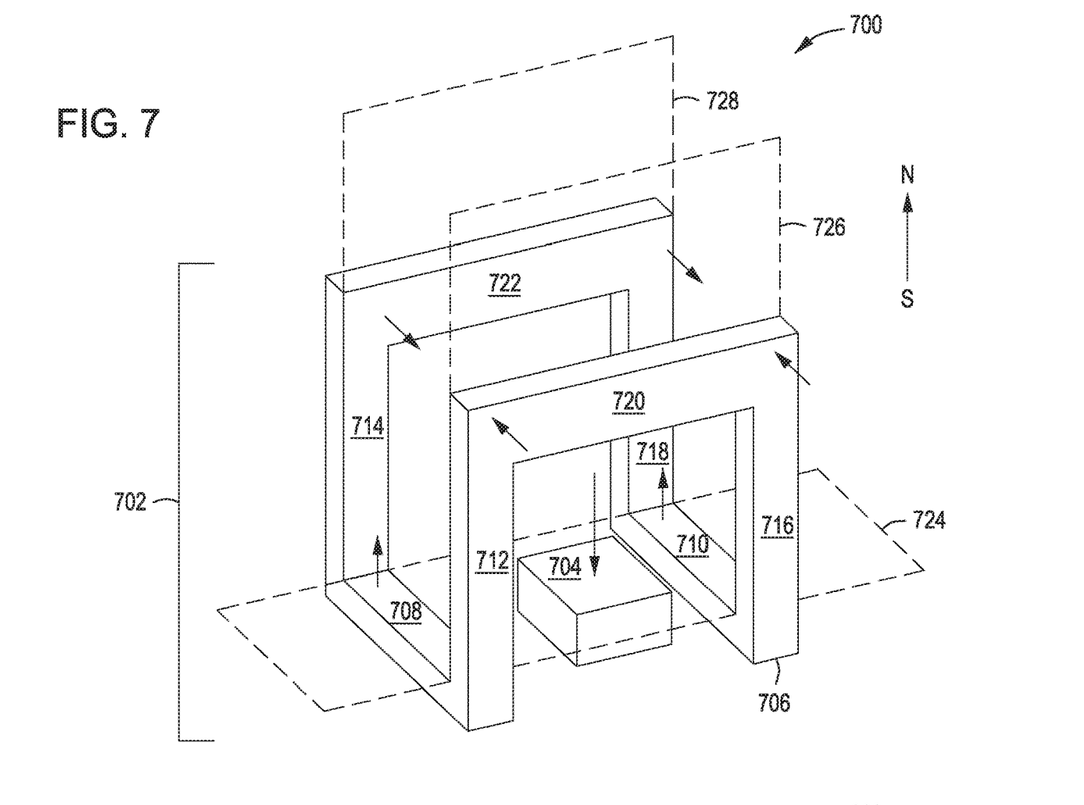
FIG. 7 is an isometric view of a 3D sputtering magnetron in accordance with some embodiments of the present principles.

FIG. 7 is an isometric view 700 of a 3D sputtering magnetron 702 in accordance with some embodiments. The 3D sputtering magnetron 702 includes a first pole piece 704 and a second pole piece 706. The first pole piece 704 is an inner pole piece with a top surface in a first plane 724. The second pole piece 706 is an outer pole piece with a first portion 708 and a second portion 710 having top surfaces in the first plane 724 and are positioned on opposite sides of the first pole piece 704. The second pole piece 706 also includes a third portion 712 with a first end connected to a first end of the first portion 708 and extending upward beyond the first plane 724 in a perpendicular direction; a fourth portion 714 with a first end connected to a second end of the first portion 708 and extending upward beyond the first plane 724 in a perpendicular direction; a fifth portion 716 with a first end connected to a first end of the second portion 710 and extending upward beyond the first plane 724 in a perpendicular direction; a sixth portion 718 with a first end connected to a second end of the second portion 710 and extending upward beyond the first plane 724 in a perpendicular direction; a seventh portion 720 with a first end connected to a second end of the third portion 712 and a second end connected to a second end of the fifth portion 716; and an eighth portion 722 with a first end connected to a second end of the fourth portion 714 and a second end connected to a second end of the sixth portion 718.

In some embodiments, an inner surface of the third portion 712, an inner surface of the fifth portion 716, and an inner surface of the seventh portion 720 lie in a second plane 726 perpendicular to the first plane 724 and an inner surface of the fourth portion 714, an inner surface of the sixth portion 718, and an inner surface of the eighth portion 722 lie in a third plane 728 perpendicular to the first plane 724 and parallel to the second plane 726. The lengths of the third portion 712, fourth portion 714, the fifth portion 716, the sixth portion 718 may be equal or unequal. In some embodiments, the lengths of the third portion 712, fourth portion 714, the fifth portion 716, the sixth portion 718 may be adjusted to adjust target erosion from the sides of target to the back of a target.

Figure 8:
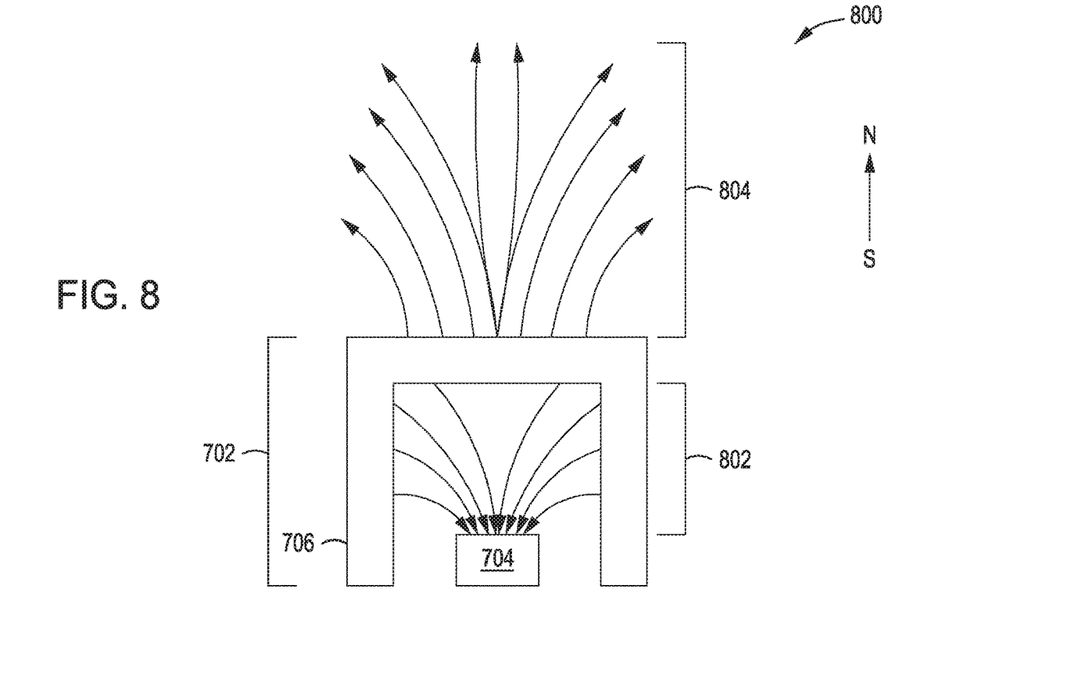
FIG. 8 is a cross-sectional view of magnetic fields of a 3D sputtering magnetron in accordance with some embodiments of the present principles.

FIG. 8 is a cross-sectional view 800 of magnetic fields of the 3D sputtering magnetron 702 of FIG. 7. In some embodiments, sputtering magnetic fields 802 are generated in a loop between the first pole piece 704 and the second pole piece 706. The sputtering magnetic fields 802 loop between portions of the second pole piece 706 that would pass through the top and bottom of the hollow sputtering target 206 of FIG. 4. The hollow sputtering target 206 would sputter not only from the inner back surface 404 but also from the inner bottom surface 402 and the inner top surface 406. In addition to the sputtering magnetic fields 802, extraction magnetic fields 804 are also generated by the 3D sputtering magnetron 702 to extract electrons (and ions) and from the target region and push the electrons (and ions) towards the substrate 202. With magnets such as the first magnet assembly 218 and/or the second magnet assembly 220, the extracted electrons (and ions) may be further pushed towards the substrate 202.

While the foregoing is directed to embodiments of the present principles, other and further embodiments of the principles may be devised without departing from the basic scope thereof.

The invention claimed is:

1. A three dimensional (3D) magnetron for plasma deposition on a substrate; comprising:
an inner pole piece with a top surface in a first plane; and
an outer pole piece, comprising:
a first portion and a second portion having top surfaces in the first plane, wherein the first portion and the second portion are positioned on opposite sides of the inner pole piece;
a third portion with a first end connected to a first end of the first portion and extending upward beyond the first plane in a perpendicular direction;
a fourth portion with a first end connected to a second end of the first portion and extending upward beyond the first plane in a perpendicular direction;
a fifth portion with a first end connected to a first end of the second portion and extending upward beyond the first plane in a perpendicular direction;
a sixth portion with a first end connected to a second end of the second portion and extending upward beyond the first plane in a perpendicular direction;
a seventh portion with a first end connected to a second end of the third portion and a second end connected to a second end of the fifth portion; and
an eighth portion with a first end connected to a second end of the fourth portion and a second end connected to a second end of the sixth portion.

2. The 3D magnetron of claim 1, wherein an inner surface of the third portion, an inner surface of the fifth portion, and an inner surface of the seventh portion lie in a second plane perpendicular to the first plane and an inner surface of the fourth portion, an inner surface of the sixth portion, and an inner surface of the eighth portion lie in a third plane perpendicular to the first plane and parallel to the second plane.

3. The 3D magnetron of claim 1, herein the inner pole piece has a first set of one or more magnets to generate a first polarity and the outer pole piece has a second set of one or more magnets to generate a second polarity.

4. An apparatus for sputter deposition in a semiconductor chamber, comprising:
a three dimensional (3D) magnetron;
a sputtering target with a hollow inner area and with at least a portion of at least one side overlapped by the 3D magnetron, wherein the 3D magnetron moves in a linear motion over a length of the sputtering target; and
a housing surrounding the 3D magnetron and the sputtering target such that at least one side of the housing exposes the hollow inner area of the sputtering target.

5. The apparatus of claim 4, further comprising:
cooling inlets on the housing such that a cooling liquid can come into contact with the 3D magnetron to decrease a temperature of the 3D magnetron.

6. An apparatus for sputter deposition in a semiconductor chamber comprising:
a three-dimensional (3D) magnetron;
a sputtering target with a hollow inner area and with at least a portion of at least one side overlapped by the 3D magnetron;
a housing surrounding the 3D magnetron and the sputtering target such that at least one side of the housing exposes the hollow inner area of the sputtering target; and
a motor interrelating with the 3D magnetron to move the 3D magnetron in a linear motion over a length of the sputtering target.

7. The apparatus of claim 6, further comprising:
a second magnetron for cleaning sides of the sputtering target, wherein the second magnetron interrelates with a motor to move the second magnetron in a linear motion over the length of the sputtering target.

8. The apparatus of claim 7, wherein the housing allows either of the 3D magnetron or the second magnetron to be stored beyond either end of the sputtering target.

9. An apparatus for plasma deposition, comprising:
a process chamber having an inner processing volume;
a three dimensional (3D) magnetron with a sputtering target with a hollow inner area, wherein the 3D magnetron overlaps at least a portion of sides of the sputtering target and moves in a linear motion over a length of the sputtering target;
a housing surrounding the 3D magnetron and the sputtering target such that at least one side of the housing exposes the hollow inner area of the sputtering target; and
a linear channel interposed between the housing and a wall of the process chamber.

10. The apparatus of claim 9, wherein an angle of the linear channel and the housing relative to the wall of the process chamber is less than 45 degrees.

11. The apparatus of claim 9, further comprising:
a collimation plate affixed to at least a portion of a bottom of the linear channel.

12. The apparatus of claim 11, further comprising:
a biasing power source electrically connected to the collimation plate.

13. The apparatus of claim 12, wherein the biasing power source provides up to approximately 30 volts.

14. The apparatus of claim 11, further comprising:
a first magnetic assembly with at least one magnet positioned beneath the collimation plate in atmosphere.

15. The apparatus of claim 14, wherein the first magnetic assembly has at least one electromagnet.

16. The apparatus of claim 11, further comprising:
a second magnetic assembly with at least one magnet positioned above at least a portion of the collimation plate.

17. The apparatus of claim 16, wherein the second magnetic assembly has at least one electromagnet.

18. The apparatus of claim 9, further comprising:
a substrate support located within the inner processing volume of the process chamber and configured to move in a horizontal direction at a constant velocity.

19. The apparatus of claim 9, further comprising:
a substrate support located within the inner processing volume of the process chamber and configured to move in a vertical direction with a variable velocity.
20. The apparatus of claim 9, further comprising:
a second magnetron positioned within the housing which is configured to clean the sputtering target and moves in a linear motion over the length of the sputtering target.

\* \* \* \* \*